(12) United States Patent
Topucharla et al.

(10) Patent No.: US 9,304,168 B2
(45) Date of Patent: Apr. 5, 2016

(54) METHODS AND APPARATUS FOR TESTING AN ELECTRONIC TRIP DEVICE

(71) Applicant: General Electric Company, Schenectady, NY (US)

(72) Inventors: Srinath Rao Topucharla, Secunderabad (IN); Chandrashekar Nagawaram, Hyderabad (IN); Alok Kumar Bharati, Hyderabad (IN); Craig Benjamin Williams, Louisville, KY (US); Rajani Karra, Hyderabad (IN)

(73) Assignee: General Electric Company, Schenectady, NY (US)

( * ) Notice: Subject to any disclaimer, the term of this patent is extended or adjusted under 35 U.S.C. 154(b) by 431 days.

(21) Appl. No.: 13/662,965

(22) Filed: Oct. 29, 2012

(65) Prior Publication Data

US 2014/0117995 A1 May 1, 2014

(51) Int. Cl.
*G01R 31/327* (2006.01)
*H02H 3/33* (2006.01)

(52) U.S. Cl.
CPC ........... *G01R 31/3277* (2013.01); *H02H 3/335* (2013.01)

(58) Field of Classification Search
CPC ... G01R 31/3277; G01R 31/327; H02H 3/335
USPC ........................................................ 324/424
See application file for complete search history.

(56) References Cited

U.S. PATENT DOCUMENTS

| | | | |
|---|---|---|---|
| 4,814,712 A | 3/1989 | Burton et al. | |
| 4,816,957 A | 3/1989 | Irwin | |
| 5,459,630 A | 10/1995 | MacKenzie et al. | |
| 5,596,473 A * | 1/1997 | Johnson et al. | 361/97 |
| 6,055,145 A | 4/2000 | Lagree et al. | |
| 6,262,871 B1 | 7/2001 | Nemir et al. | |
| 6,980,005 B2 | 12/2005 | Finlay, Sr. et al. | |
| 7,315,437 B2 | 1/2008 | Bonilla et al. | |
| 7,852,606 B2 | 12/2010 | Mernyk et al. | |
| 7,936,543 B2 | 5/2011 | Restrepo et al. | |
| 7,986,501 B2 | 7/2011 | Kamor et al. | |

(Continued)

FOREIGN PATENT DOCUMENTS

| | | | |
|---|---|---|---|
| GB | 2380554 A * | 4/2003 | |
| WO | 2006128233 A1 | 7/2006 | |

OTHER PUBLICATIONS

Ge, "Ground Fault Current Detection Systems," Aug. 2006, 6 pages.

(Continued)

*Primary Examiner* — Melissa Koval
*Assistant Examiner* — Courtney McDonnough
(74) *Attorney, Agent, or Firm* — General Electric Company

(57) ABSTRACT

An electronic trip device is described that includes a test current generator and a leakage current detection circuit. The test current generator is coupled to a conductor and configured to provide a test current having a magnitude to the conductor in response to a selection to test the electronic trip device. The conductor is a line conductor or a neutral conductor. The leakage current detection circuit is configured to detect a current difference between the neutral conductor and the line conductor. The leakage current detection circuit is configured to provide, in response to the selection to test the electronic trip device, a tripless error indication if the detected current difference is less than a first threshold value.

8 Claims, 8 Drawing Sheets

(56) References Cited

U.S. PATENT DOCUMENTS

| | | |
|---|---|---|
| 8,023,235 B2 | 9/2011 | Bilac et al. |
| 8,081,001 B2 | 12/2011 | Hooper et al. |
| 8,159,793 B2 | 4/2012 | Hall et al. |
| 8,159,794 B2 | 4/2012 | Baldwin et al. |
| 2007/0086127 A1* | 4/2007 | Huang .......................... 361/42 |
| 2007/0177325 A1* | 8/2007 | Zandonella Balco ......... 361/118 |
| 2010/0149711 A1 | 6/2010 | Larson et al. |
| 2010/0165520 A1 | 7/2010 | Williams |
| 2011/0222194 A1* | 9/2011 | Kinsel et al. .................... 361/42 |
| 2012/0119918 A1* | 5/2012 | Williams ...................... 340/664 |

OTHER PUBLICATIONS

Schneider Electric, "Electronic Trip Circuit Breaker Basics," Mar. 2012, 14 pages.

* cited by examiner

METHODS AND APPARATUS FOR TESTING AN ELECTRONIC TRIP DEVICE

BACKGROUND OF THE INVENTION

The field of the invention relates generally to an electronic trip device, and more specifically, to methods and systems for testing of a residual current device (RCD).

Circuit breakers currently used to protect, for example, a residential or commercial environment, generally detect the presence of overcurrent conditions and release an operating mechanism to separate the circuit breaker contacts. A circuit breaker may also include ground fault detection capabilities, for example, by including an electronic trip device. An electronic trip device may also be referred to as an electronic trip control unit. A circuit breaker that disconnects a circuit when it detects that electric current is not balanced between conductors, for example between a line conductor and a neutral conductor, may be referred to as a residual current device (RCD). RCDs include, for example, ground fault circuit interrupters (GFCIs), ground fault interrupters (GFIs), appliance leakage current interrupters (ALCIs), residual-current circuit breakers with overload protection (RCBOs), and electronic residual-current circuit breakers with overload protection (eRCBOs).

Some known systems include an RCD test circuit. When a user initiates a test of the RCD using the test circuit, a leakage current greater than the trip threshold of the RCD is provided. If the RCD circuit is functioning properly, the RCD senses the created current imbalance and trips the circuit. As used herein, a test of an RCD circuit that includes tripping of the circuit is referred to as an active test of the RCD circuit.

BRIEF DESCRIPTION OF THE INVENTION

In one aspect, an electronic trip device includes a test current generator and a leakage current detection circuit. The test current generator is coupled to a conductor and configured to provide a test current having a magnitude to the conductor in response to a selection to test the electronic trip device. The conductor is a first conductor or a second conductor. The leakage current detection circuit is configured to detect a current difference between the first conductor and the second conductor. The leakage current detection circuit is configured to provide, in response to the selection to test the electronic trip device, a tripless error indication if the detected current difference is less than a first threshold value.

In another aspect, a method for operating an electronic trip device coupled to a line conductor, a neutral conductor, and a ground is described. The method providing a test current having a magnitude to one of the line conductor and the neutral conductor in response to a selection to test the electronic trip device, detecting a current difference between the neutral conductor and the line conductor, and providing, in response to the selection to test the electronic trip device, a tripless error indication if the detected current difference is less than a first threshold value.

In another aspect, a residual current device (RCD) includes a sensor, a test current generator, and a detection circuit. The sensor is configured to detect a current difference between at least two conductors and output a detection signal proportional to the current difference. The test current generator is configured to provide, in response to a selection to test the RCD, a test signal to produce a current difference detectable by the sensor. The detection circuit is coupled to the sensor. The detection circuit is configured to compare the detection signal to a trip threshold and output a trip signal if the detection signal exceeds the trip threshold. The detection circuit is configured to compare the detection signal to a test threshold in response to the selection to test the RCD and provide an indication of whether the RCD is functioning properly. The test threshold is less than the trip threshold.

DETAILED DESCRIPTION OF THE INVENTION

The methods and apparatus described herein facilitate testing of a residual current device (RCD), without interrupting the delivery of power to a load protected by the RCD. Although described herein with respect to a RCD, the methods and apparatus described herein may also be included within, or used in conjunction with, electronic trip devices, circuit breakers, and/or any other suitable circuit protection devices.

Technical effects of the methods and apparatus described herein include at least one of: (a) providing a test current within at least one of a line conductor and a neutral conductor in response to a selection to test the electronic trip device; (b) detecting a current difference between the line conductor and the neutral conductor; and (c) providing, in response to the selection to test the electronic trip device, a tripless error indication if an absolute value of the detected current difference is less than a first threshold value.

Figure 1:
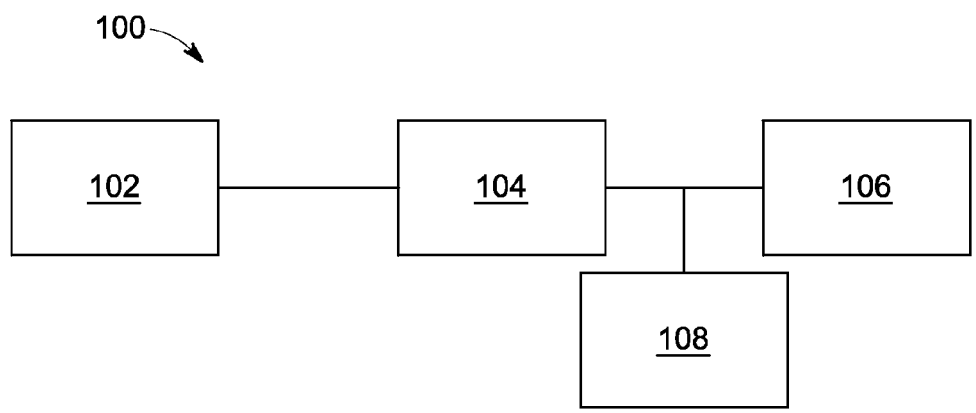
FIG. 1 is a block diagram of an exemplary electronic trip device.
Figure 2:
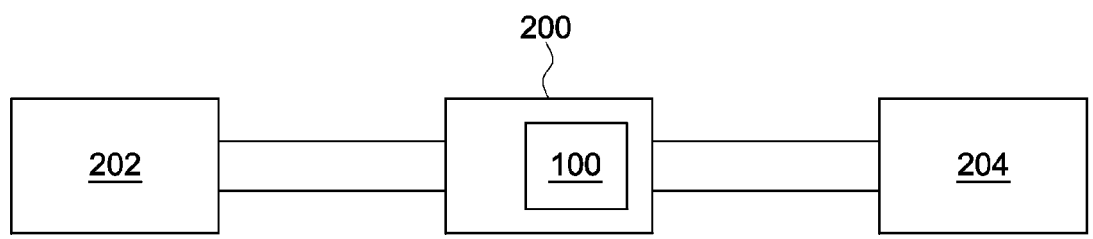
FIG. 2 is a block diagram of an exemplary residual current device (RCD) including the electronic trip device shown in FIG. 1.

FIG. 1 is block diagram of an exemplary electronic trip device 100. FIG. 2 is a block diagram of an exemplary RCD 200 including electronic trip device 100. In the exemplary embodiment, electronic trip device 100 includes a test signal generator 102, a leakage current detection circuit 104, and a trip circuit 106. Electronic trip device 100 also includes a test indicator circuit 108. Electronic trip device 100 is included within RCD 200, which is included within a circuit (not shown). Electronic trip device 100 facilitates protecting the circuit by interrupting the circuit (i.e., opening the circuit) upon sensing a ground fault condition.

Test signal generator 102 generates a test signal in response to a selection to test electronic trip device 100. In the exemplary embodiment, the selection to test electronic trip device 100 is a selection by a user, such as via pushing a button, toggling a switch, etc. In other embodiments, the selection to test electronic trip device 100 may be a signal from another electronic device or system instructing RCD 200 to test electronic trip device 100. In the exemplary embodiment, test signal generator 102 generates an intentional test leakage current. Test signal generator 102 may also be described as causing the intentional test leakage current. The test leakage current has a known magnitude and is used to self-test device 100.

Leakage current detection circuit 104 monitors current flow to detect a ground fault condition. During normal operation of the circuit, a current entering device 100 through a first conductor, referred to herein as a line current, from a power source 202 (shown in FIG. 2) substantially equals the current returned to device 100 through a second conductor, referred to herein as a load current, from a load 204 (shown in FIG. 2). In embodiments in which device 100 has more than one line conductor, e.g. a three phase device 100 having three line conductors, the vector sum of the currents on all line conductors is the line current and, in normal operation, substantially equals the load current during normal operation. In the event of a ground fault condition, for example a short from load 204 to ground (i.e., an unintended path from load 204 to ground), the load current returned to device 100 is less than the line current entering device 100. Leakage current detection circuit 104 identifies the difference between the load current and the line current, which is referred to herein as a leakage current. Trip circuit 106 opens, uncoupling power source 202 from load 204, if the difference between the load current and the line current is greater than a predefined trip threshold. Uncoupling power source 202 from load 204 is referred to herein as tripping device 100.

In the exemplary embodiment, test signal generator 102 intentionally creates a difference between the line current and the load current by providing a test current having a known magnitude to a line conductor or a neutral conductor (not shown) in response to a selection to test electronic trip device 100. In the exemplary embodiment, leakage current detection circuit 104 is configured to detect a current difference between the line conductor and the neutral conductor. In other embodiments, leakage current detection circuit 104 is configured to detect a current difference between the line conductor and ground or between the neutral conductor and ground. In embodiments having more than one line conductor, leakage detection circuit 104 treats the sum of the current on the multiple line conductors as a single line conductor current and detects the current difference between the line conductor current sum and the neutral conductor current.

Not sensing the test leakage current is an indication that device 100 is not functioning properly. Leakage current detection circuit 104 is configured to determine whether or not an absolute value of the detected current difference is less than a first threshold value. In the exemplary embodiment, the first threshold value is substantially equal to the magnitude of the test leakage current. Thus, in the exemplary embodiment, if leakage detection circuit 104 does not detect a current difference whose absolute value is equal to or greater than the magnitude of the test current, leakage detection circuit 104 knows that electronic trip device 100 is not functioning properly. In other embodiments, the first threshold may be any other suitable value, including a value that is proportional to the magnitude of the test leakage current. In response to the user selection to test electronic trip device 100, the exemplary leakage current detection circuit 104 provides an error indication without tripping electronic trip device 100 (sometimes referred to herein as a tripless error indication) if the detected current difference does not include the test current (e.g., if the current difference does not equal or exceed the magnitude of the test current). As used herein, "passive testing," "passively testing," and "passively test" are defined as testing a RCD, including testing electronic trip device 100, without tripping the device as part of the test. Similarly, a "passive test" is defined as a test of an RCD, including a test of electronic trip device 100, that does not include tripping of the device as part of the test.

Leakage current detection circuit 104 provides the error indication through indicator circuit 108. In the exemplary embodiment, indicator circuit 108 provides a user with a visual indication of whether the test of electronic trip device 100 passed or failed. The indication may include, but is not limited to, a visual indication (e.g., an illuminated LED) and/or an audio indication (e.g., sounding an alarm). In other embodiments, leakage current detection circuit 104 provides the error indication, additionally or alternatively, other than through indicator circuit 108. For example, in some embodiments, leakage detection circuit 108 provides a signal indicative of whether electronic trip device 100 passed or failed the test to another device or system. For example, leakage detection circuit may provide an electronic signal indicating whether electronic trip device 100 passed or failed the test to a system controller or monitoring system. The signal indicating whether electronic trip device 100 passed or failed the test may be transmitted by wired or wireless communication using any suitable communication protocol. In the exemplary embodiment, indicator circuit 108 includes an LED. The LED is illuminated if electronic trip device 100 passes the test and not illuminated if electronic trip device 100 passes the test. In other embodiments, the LED may be illuminated to indicate that electronic trip device 100 failed the test and not illuminated to indicate the test was passed. In still other embodiments, any other suitable combination of visual and/or audible indications (including multiple LEDs) of whether electronic trip device 100 passed or failed the test may be used.

In some embodiments, electronic trip device 100 is configured to permit a user to actively test electronic trip device 100 including tripping electronic trip device 100. In such embodiments, the user may select to actively test electronic trip device 100 with tripping or passively test without tripping electronic trip device 100. Testing without electronic tripping occurs as described above and elsewhere herein. Testing electronic trip device 100 with tripping causes trip circuit 106 to trip in response to detection of the test current. In some embodiments, active testing causes leakage current detection circuit 104 to initiate a trip in response to the detected current being greater than or equal to the first threshold. In other embodiments, active testing causes test signal generator 102 to provide a tripping test signal having a magnitude greater than a second threshold, which may be the trip threshold. In such embodiments, leakage current detection circuit 104 causes trip circuit 106 to trip if the absolute value of the detected current is greater than or equal to a second threshold (which is equal or proportional to the tripping test signal), which is greater than the first threshold. In some embodiments, tripping of electronic trip device 100 is accompanied by one or more visual and/or audible indications of whether or not electronic trip device 100 passed the test of electronic trip device 100. When the detected current equals or exceeds the trip threshold, leakage current detection circuit 104 initiates a trip regardless of whether active testing, passive testing, or no testing is being performed.

Figure 3:
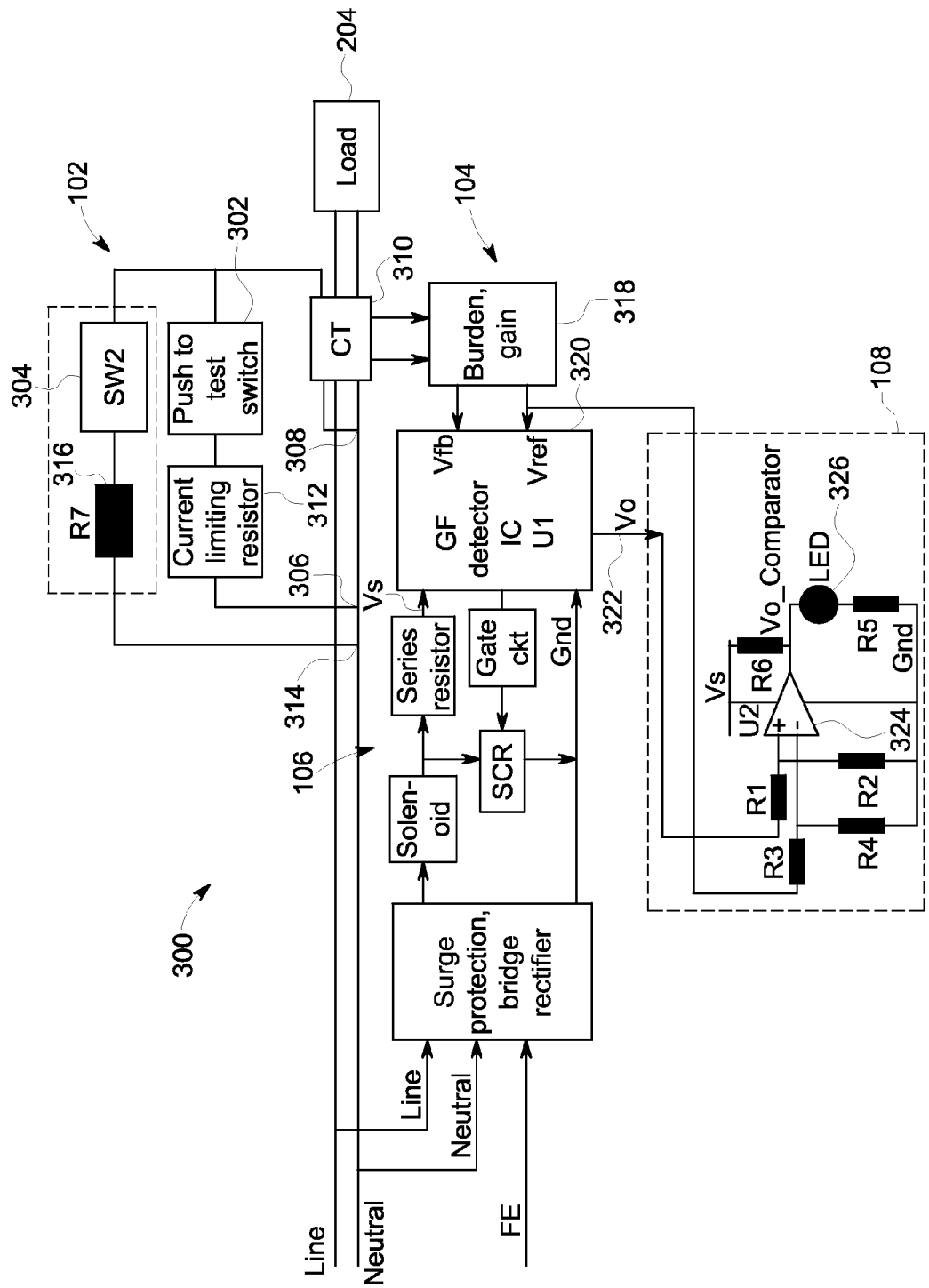
FIG. 3 is a diagram of a first exemplary electronic trip device suitable for use as the electronic trip device shown in FIG. 1.

FIG. 3 is an example electronic trip device 300 suitable for use as electronic trip device 100. Power from source 202 (not shown in FIG. 3) is provided to load 204 through a line conductor and a neutral conductor of electronic trip device 300. During normal (i.e., non-testing) operation, electronic trip device 300 operates as a common RCD circuit as well understood by those of ordinary skill in the art. In general, leakage detection circuit 104 monitors the current through electronic trip device 300 and signals trip circuit 106 to trip, and thereby interrupt delivery of power to load 204, upon detection of a leakage current that exceeds a trip threshold.

Test signal generator 102 includes a first switch 302 and a second switch 304 to receive a user selection to test electronic trip device 300. When first switch 302 is selected, i.e. pushed, toggled, etc., it initiates active test of electronic trip device 300 including tripping of electronic trip device 300. Second switch 304 initiates a passive test of electronic trip device 300 without tripping of electronic trip device 300. In the exemplary embodiment, first and second switches 302 and 304 are normally open, push style, contact switches. In other embodiments, any other suitable types of switches, including normally closed switches, may be used.

When a user activates first switch 302 to initiate an active test, current from a first point 306 of the neutral conductor is coupled to a second point 308 of the neutral conductor through a sensor 310 of leakage detection circuit 104. In other embodiments, first point 306 and second point 308 are points on the line conductor. The current coupled from first point 306 to second point 308 is sometimes referred to herein as a test signal. Sensor 310 detects the test signal provided via first switch 302. More particularly, in the exemplary embodiment, sensor 310 is a current transformer that detects an imbalance of current between the line conductor and the neutral conductor. In other embodiments, sensor 310 may be any other suitable sensor. A first resistor 312 coupled to first switch 302 determines the amount, or magnitude, of current coupled from first point 306 to second point 308. The resistance of first resistor 312 is selected to permit sufficient current to flow between first point 306 and second point 308 to exceed the trip threshold. If electronic trip device 300 is operating properly, leakage detection circuit 104 will cause trip circuit 106 to trip in response to the current imbalance detected by sensor 310 exceeding the trip threshold. In some embodiments, leakage detection circuit 104 also causes test indicator circuit 108 to indicate whether electronic trip device 300 passed or failed the test.

When a user activates second switch 304 to select to initiate a passive test, current from a third point 314 of the neutral conductor is delivered to second point 308 through current transformer 310. In other embodiments, third point 314 and second point 308 are points on the line conductor. In some embodiments, second switch 304 delivers current from first point 306 to second point 308. In some embodiments, second switch 304 provides current to a point along the neutral conductor other than second point 308. Sensor 310 detects the imbalance of current between the line conductor and the neutral conductor. A second resistor 316 coupled to second switch 304 determines the amount of current delivered from third point 314 to second point 308. The resistance of second resistor 316 is selected to permit a magnitude of current to flow between third point 314 and second point 308 that will not exceed the trip threshold. Because the current imbalance detected by sensor 310 does not exceed the trip threshold, leakage detection circuit 104 will not cause trip circuit 106 to trip. Rather, if electronic trip device 300 is operating properly, leakage detection circuit 104 causes test indicator circuit to indicate that electronic trip device 300 passed the test. If electronic trip device 300 is not operating properly, leakage detection circuit 104 causes test indicator circuit 108 to indicate that electronic trip device 300 has failed the test.

Leakage current detection circuit 104 includes sensor 310, gain element 318, and a ground fault detector 320. As described above sensor 310 is a current sensor configured to detect a difference between the line conductor and the neutral conductor. In other embodiments, sensor 31 is configured to detect a current difference between the line conductor and ground or between the neutral conductor and ground. A current imbalance between the neural conductor and the line conductor causes sensor 310 to output a signal proportional to the detected current difference to gain element 318. Gain element 318 applies a predetermined amount of gain to the signal from sensor 310 and passes the amplified signal to ground fault detector 320. Ground fault detector 320 compares the amplified signal to one or more thresholds to determine whether or not a ground fault condition exists. If the amplified signal exceeds the trip threshold, ground fault detector 320 causes trip circuit 106 to interrupt power flow through electronic trip device 300. The amplified signal will typically exceed the trip threshold if there is an actual ground fault, or if electronic trip device 300 is functioning properly and the test signal has been generated by first switch 302.

An output 322 of ground fault detector 320 is coupled to test indicator circuit 108. Output 322 is proportional to the current imbalance detected by sensor 310. In the exemplary embodiment, output 322 is a voltage whose magnitude is proportional to the current imbalance. In other embodiments, output 322 is a pulse width modulated signal whose duty cycle is proportional to the current imbalance. Test indicator circuit 108 compares output 322 with a reference signal to determine whether the current imbalance exceeds a first threshold, also referred to herein as a test threshold. The test threshold is the expected current imbalance provided when second switch 304 is activated to initiate a test of electronic trip device 300 without tripping electronic trip device 300. Thus, test indicator circuit 108 determines whether or not the test signal provided by second switch 304 has been detected. The test threshold is less than the trip threshold. As described above, second switch 304 provides a current with a magnitude smaller than the amount represented by the trip threshold. In the exemplary embodiment, second switch 304 provides a current of about twenty percent of the trip threshold current. Thus, the test threshold utilized by test indicator circuit 108 is twenty percent of the trip threshold. In other embodiments, other relationships between the trip threshold and the test threshold are used.

The comparison of output 322 to the test threshold is performed by comparator 324 in conjunction with resistors R1-R4. If output 322 exceeds the test threshold, indicator circuit 108 changes the state of a light emitting diode (LED) 326. In the exemplary embodiment, indicator circuit 108 illuminates LED 326 when output 322 exceeds the test threshold to indicate that the electronic trip device 300 passed the test. When output 322 does not exceed the test threshold, indicator circuit does not illuminate LED 326, thus indicating electronic trip device 300 failed the test. In other embodiments, LED 326 is illuminated to indicate electronic trip device 300 failed the test and turned off to indicate electronic trip device 300 passed the test. In some embodiments, indicator circuit 108 includes an indicator other than, or in addition to, LED 326. For example, in some embodiments, indicator circuit 108 includes an audible indicator to indicate whether or not electronic trip device 300 passed the test.

Figure 4:
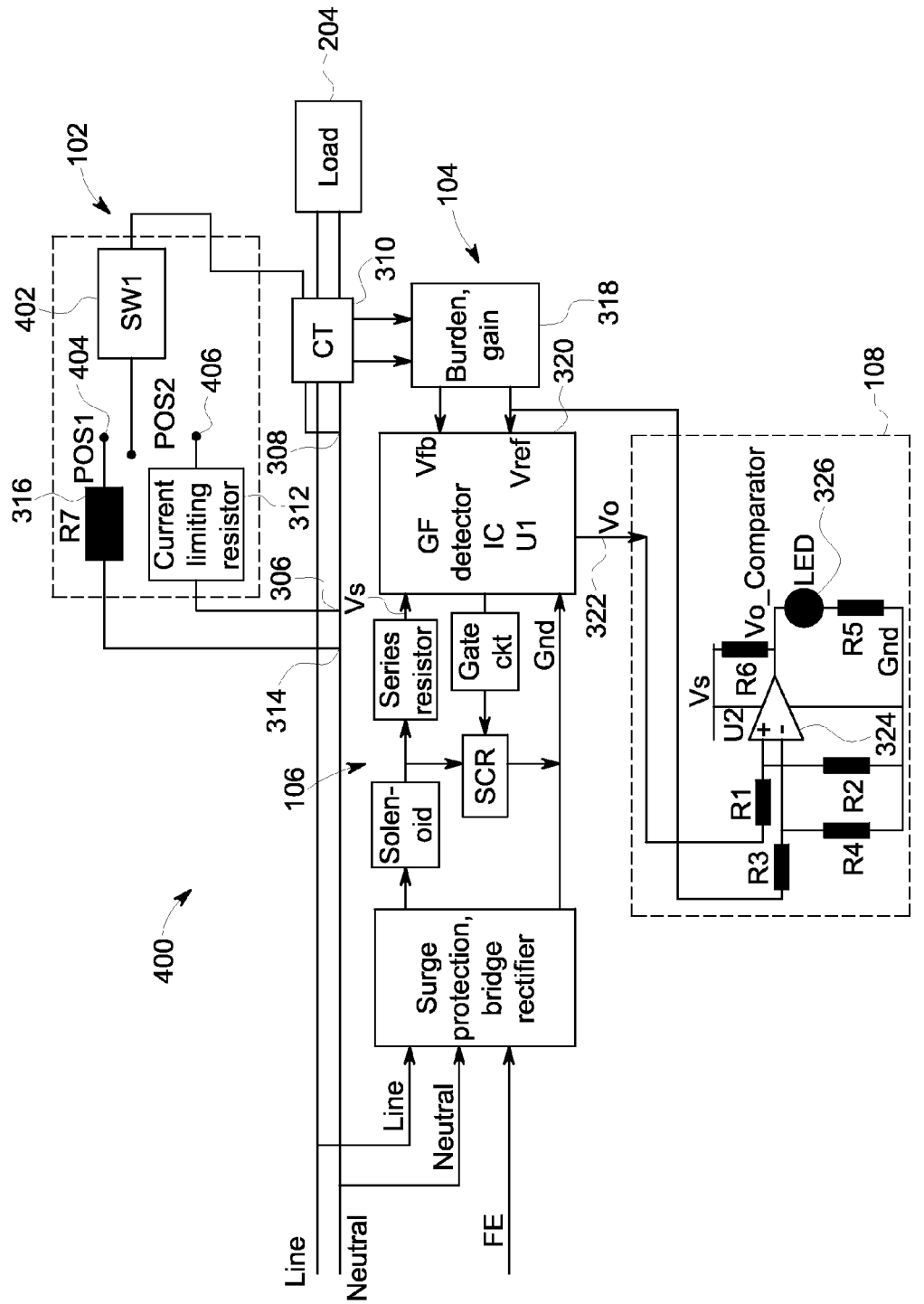
FIG. 4 is a diagram of a second exemplary electronic trip device suitable for use as the electronic trip device shown in FIG. 1.

FIG. 4 is an example electronic trip device 400 suitable for use as electronic trip device 100. Except as described below, electronic trip device 400 is substantially identical to electronic trip device 300 (shown in FIG. 3) and operates in a similar manner. Components common to electronic trip devices 300 and 400 are identified by the same reference numbers.

In electronic trip device 400, test signal generator 102 includes a multi-position switch 402 rather than first and second switches 302 and 304 (shown in FIG. 3). Multi-position switch 402 permits a user to select to initiate a passive test of electronic trip device 400 without tripping of electronic trip device 400 or select to initiate an active test of electronic trip device 400 including tripping of electronic trip device 400. In the exemplary embodiment, multi-position switch 402 returns to a disconnected position, as shown in FIG. 4, absent input by the user. When the user moves switch to a first position to connect to first contact 404, current from third point 314 of the neutral conductor is coupled to second point 308 through current transformer 310. When the user moves switch to a second position to connect to a second contact 406, current from first point 306 of the neutral conductor is coupled to second point 308 of the neutral conductor through current transformer 310. The remainder of electronic trip device 400 operates as described above with respect to electronic trip device 300.

Figure 5:
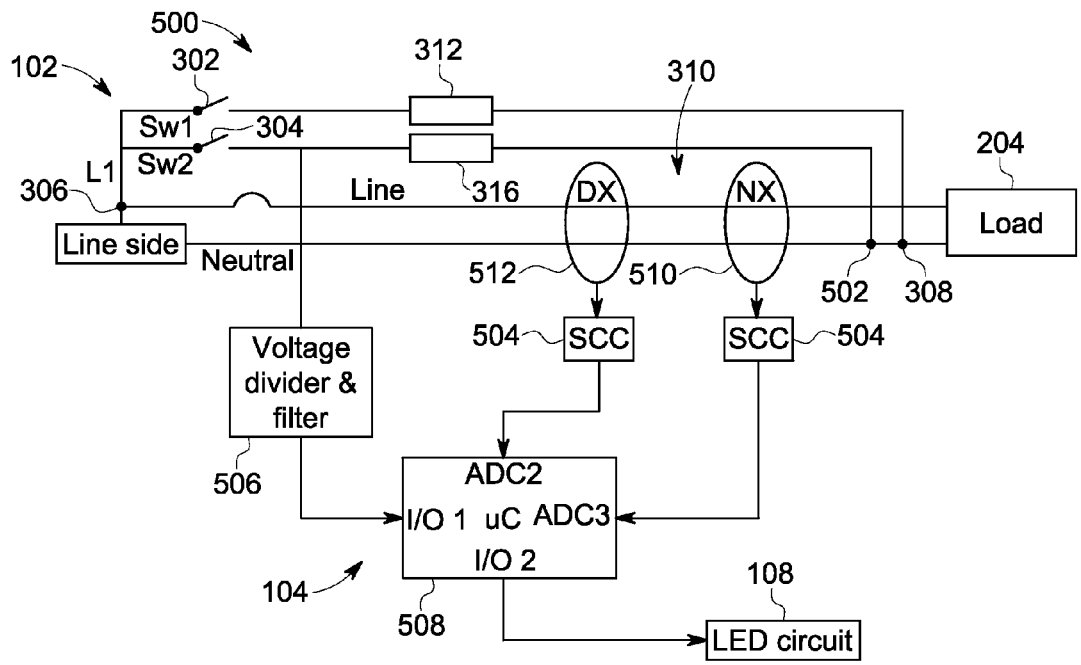
FIG. 5 is a diagram of a third exemplary electronic trip device suitable for use as the electronic trip device shown in FIG. 1.

FIG. 5 is an example electronic trip device 500 suitable for use as electronic trip device 100. Components that electronic trip device 500 has in common with electronic trip devices 300 and 400 are identified by the same reference numbers. Power from source 202 (not shown in FIG. 5) is provided to load 204 through a line conductor and a neutral conductor of electronic trip device 500. During normal (i.e., non-testing) operation, electronic trip device 500 operates as a common RCD circuit as well understood by those of ordinary skill in the art. In general, leakage detection circuit 104 monitors the current through electronic trip device 500 and signals trip circuit 106 (not shown in FIG. 5) to trip, and thereby interrupt delivery of power to load 204, upon detection of a leakage current that exceeds a trip threshold.

Test signal generator 102 includes first switch 302 and second switch 304. First switch 302 initiates an active test of electronic trip device 500 including tripping of electronic trip device 500. Second switch 304 initiates a passive test of electronic trip device 500 without tripping of electronic trip device 500.

When a user activates first switch 302, current from first point 306 is coupled to second point 308 of the neutral conductor. Sensor 310 detects the test signal provided via first switch 302. First resistor 312 coupled to first switch 302 determines the amount of current coupled from first point 306 to second point 308. The resistance of first resistor 312 is selected to permit sufficient current to flow between first point 306 and second point 308 to exceed the trip threshold. If electronic trip device 500 is operating properly, leakage detection circuit 104 will cause trip circuit 106 to trip in response to the current imbalance detected by sensor 310. In some embodiments, leakage detection circuit 104 also causes test indicator circuit 108 to indicate whether electronic trip device 500 passed or failed the test.

When a user activates second switch 304, current from first point 306 of the neutral conductor is coupled to a fourth point 502 on neutral conductor. Sensor 310 detects the imbalance of current between the line conductor and the neutral conductor. Second resistor 316 coupled to second switch 304 determines the amount of current coupled from third point 314 to second point 308. Because the current imbalance detected by sensor 310 does not exceed the trip threshold, leakage detection circuit 104 will not cause trip circuit 106 to trip. Rather, if electronic trip device 500 is operating properly, leakage detection circuit 104 causes test indicator circuit 108 to indicate that electronic trip device 500 passed the test. If electronic trip device 300 is not operating properly, leakage detection circuit 104 causes test indicator circuit 108 to indicate that electronic trip device 500 has failed the test.

In electronic trip device 500, leakage current detection circuit 104 includes sensor 310, signal conditioners 504, a voltage divider and filter 506, and a controller 508. In this embodiment, sensor 310 is a current sensor including two sensor coils, an NX coil 510 and a DX coil 512. NX coil 510 detects a leakage current between the neutral conductor and ground. DX coil 512 detects the current difference between the neutral conductor and the line conductor. Coils 510 and 512 output signals proportional to the detected current imbalance. The signals from sensor 310 are passed to signal conditioners 504, which filter and buffer the signals. In some embodiments, signal conditioners 504 additionally, or alternatively, amplify the signals from sensor 310. Controller 508 compares the conditioned signal to one or more thresholds to determine whether or not a ground fault condition exists. If the conditioned signal exceeds the trip threshold (whether because of an actual ground fault or because first switch 302 has been activated by the user), ground fault detector 320 causes trip circuit 106 to interrupt power flow through electronic trip device 500.

Voltage divider and filter 506 is coupled to second switch 304 to provide a signal to controller 508 when second switch 304 is activated. Thus, voltage divider and filter 506 provides a signal to controller 508 that indicates that a test without tripping electronic trip device 500 has been initiated. In response, controller 508 compares the detected current imbalance signal from sensor 310 to a test threshold less than the trip threshold. In this exemplary embodiment, the test threshold is a range of currents between a first threshold and a second threshold that is greater than the first threshold. If the detected current imbalance is within the test threshold range, controller 508 causes indicator circuit 104 to indicate that electronic trip device 500 passed the test. If the detected current imbalance is less than the first threshold, controller causes indicator circuit to indicate that electronic trip device 500 failed the test. If the detected current imbalance is greater than the second threshold, there is likely an actual fault and the controller causes trip circuit 106 to trip electronic trip device 500. In the exemplary embodiment, controller 508 is a microcontroller. In other embodiments, controller 508 is one or more central processing units, microprocessors, microcontrollers, reduced instruction set circuits (RISC), application specific integrated circuits (ASIC), logic circuits, and any other circuit or processor capable of executing the functions described herein.

Figure 6:
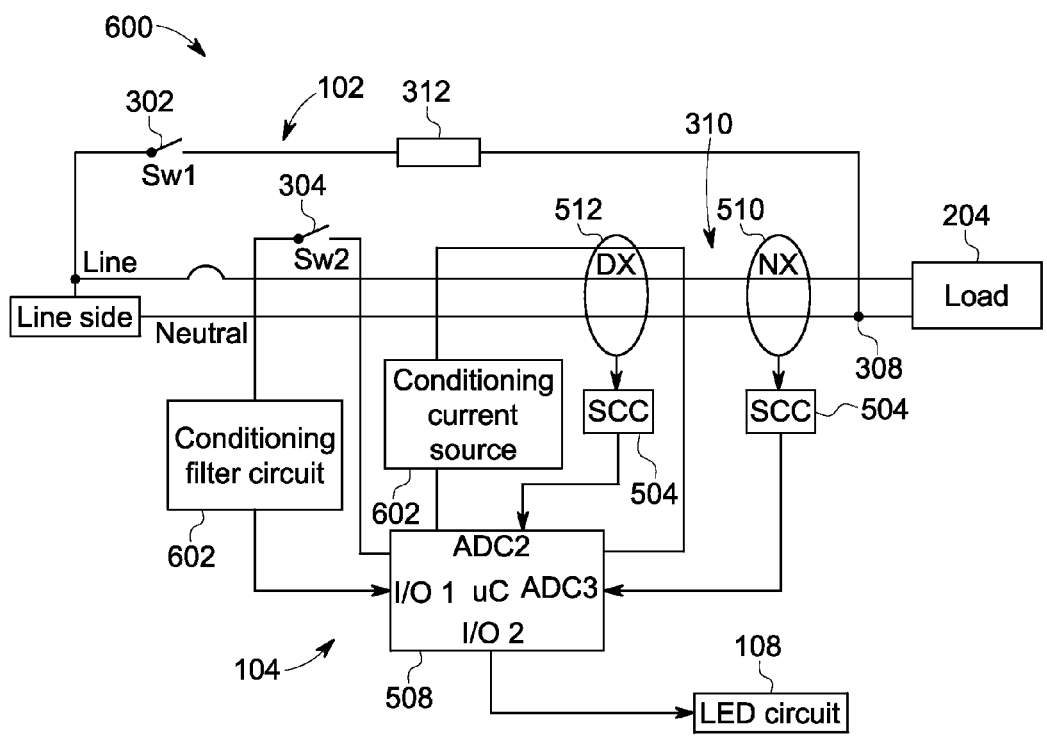
FIG. 6 is a diagram a fourth exemplary electronic trip device suitable for use as the electronic trip device shown in FIG. 1

FIG. 6 is an example electronic trip device 600 suitable for use as electronic trip device 100. Components that electronic trip device 500 has in common with electronic trip devices 300, 400, and 500 are identified by the same reference numbers. Power from source 202 (not shown in FIG. 6) is provided to load 204 through a line conductor and a neutral conductor of electronic trip device 600. During normal (i.e., non-testing) operation, electronic trip device 600 operates as a common RCD circuit as well understood by those of ordinary skill in the art. In general, leakage detection circuit 104 monitors the current through electronic trip device 600 and signals trip circuit 106 (not shown in FIG. 6) to trip, and thereby interrupt delivery of power to load 204, upon detection of a leakage current that exceeds a trip threshold.

Test signal generator 102 includes first switch 302 and second switch 304. First switch 302 initiates an active test of electronic trip device 500 including tripping of electronic trip device 500. Second switch 304 initiates a passive test of electronic trip device 500 without tripping of electronic trip device 500. In electronic trip device 600, testing with tripping via first switch 302 occurs in the same manner as described above with respect to electronic trip device 500.

In this embodiment, second switch 304 is not connected to the neutral conductor to provide a test current. Rather, a separate current source 602 generates a test current with a magnitude less than the trip threshold through sensor 310 in response to a user closing second switch 304. Second switch 304 is coupled to controller 508 via a conditioning circuit 604. When second switch 304 is closed, a signal is provided to controller 508 to indicate that second switch 304 has been closed. Controller 508 causes current source 602 to direct a test current through DX coil 512 of sensor 310. In the exemplary embodiment, the known test current provided by current source 602 is a current having a known magnitude and a waveform similar to current traveling on the line or neutral conductor. In other embodiments, the known current has a known waveform that may differ from the waveform of current travelling on the line or neutral conductor. For example, the test current may have a frequency that differs from the frequency of current in the line or neutral conductors. Sensor 310 detects the test current and provides a signal proportional to the detected current imbalance to controller 508 via one of signal conditioners 504. Because the current imbalance detected by sensor 310 does not exceed the trip threshold, leakage detection circuit 104 will not cause trip circuit 106 to trip. Rather, if electronic trip device 600 is operating properly, leakage detection circuit 104 causes test indicator circuit 108 to indicate that electronic trip device 600 passed the test. If electronic trip device 300 is not operating properly, leakage detection circuit 104 causes test indicator circuit 108 to indicate that electronic trip device 600 has failed the test.

Controller 508 compares the conditioned signal received from signal conditioners 504 to the known current that was generated by current source 602 and passed through sensor 310. Because controller 508 is coupled to second switch 304 as described above, controller knows when second switch 304 has been closed to initiate a test of electronic trip device 600 without tripping. In response, controller 508 compares the detected current imbalance signal from sensor 310 to a range between a first threshold that is less than the known current and a second threshold greater than the known current generated by current source 602. If the detected current imbalance is within the test threshold range, controller 508 causes indicator circuit 104 to indicate that electronic trip device 500 passed the test. If the detected current imbalance is less than the first threshold, controller causes indicator circuit to indicate that electronic trip device 500 failed the test. If the detected current imbalance is greater than the second threshold range, there is likely an actual fault and the controller causes trip circuit 106 to trip electronic trip device 500.

Figure 7:
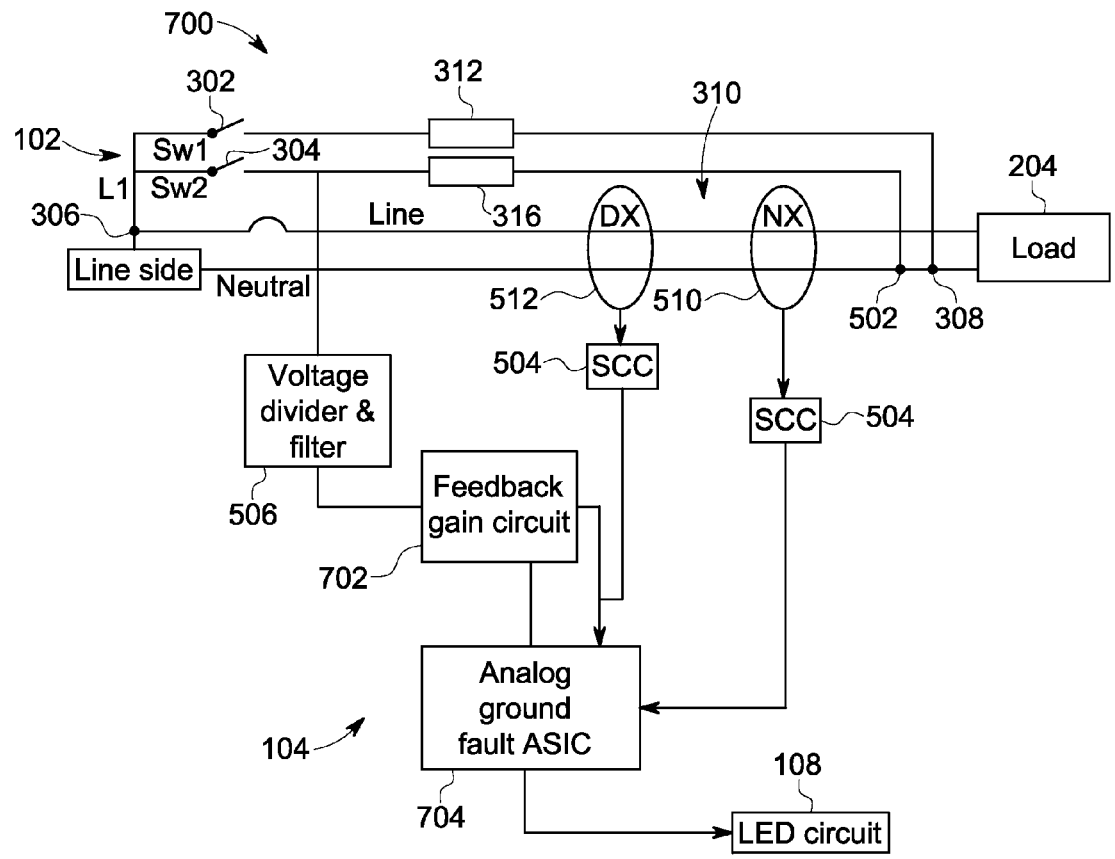
FIG. 7 is a diagram of a fifth exemplary electronic trip device suitable for use as the electronic trip device shown in FIG. 1.

FIG. 7 is another example electronic trip device 700 suitable for use as electronic trip device 100. Components that electronic trip device 700 has in common with electronic trip devices 300, 400, 500, and 600 are identified by the same reference numbers. Power from source 202 (not shown in FIG. 75) is provided to load 204 through a line conductor and a neutral conductor of electronic trip device 700. During normal (i.e., non-testing) operation, electronic trip device 700 operates as a common RCD circuit as well understood by those of ordinary skill in the art. In general, leakage detection circuit 104 monitors the current through electronic trip device 700 and signals trip circuit 106 (not shown in FIG. 7) to trip, and thereby interrupt delivery of power to load 204, upon detection of a leakage current that exceeds a trip threshold.

Test signal generator 102 includes first switch 302 and second switch 304. First switch 302 initiates a test of electronic trip device 500 including tripping of electronic trip device 500. Second switch 304 initiates a test of electronic trip device 500 without tripping of electronic trip device 500.

When a user activates first switch 302, current from first point 306 is coupled to second point 308 of the neutral conductor. Sensor 310 detects the test signal provided via first switch 302. First resistor 312 coupled to first switch 302 determines the amount of current coupled from first point 306 to second point 308. The resistance of first resistor 312 is selected to permit sufficient current to flow between first point 306 and second point 308 to exceed the trip threshold. If electronic trip device 700 is operating properly, leakage detection circuit 104 will cause trip circuit 106 to trip in response to the current imbalance detected by sensor 310. In some embodiments, leakage detection circuit 104 also causes test indicator circuit 108 to indicate whether electronic trip device 700 passed or failed the test.

When a user activates second switch 304, current from first point 306 of the neutral conductor is coupled to a fourth point 502 on the neutral conductor. Sensor 310 detects the imbalance of current between the line conductor and the neutral conductor. Second resistor 316 coupled to second switch 304 determines the amount of current coupled from first point 306 to fourth point 502. Second resistor 316 is sized to permit sufficient current to flow between first point 306 and fourth point 502 to exceed the trip threshold. A gain applied to the sensed current imbalance, however, is reduced by a known amount so that leakage detection circuit 104 will not cause trip circuit 106 to trip. Rather, if electronic trip device 700 is operating properly, leakage detection circuit 104 causes test indicator circuit 108 to indicate that electronic trip device 700 passed the test. If electronic trip device 700 is not operating properly, leakage detection circuit 104 causes test indicator circuit 108 to indicate that electronic trip device 700 has failed the test.

In electronic trip device 700, leakage current detection circuit 104 includes sensor 310, signal conditioners 504, voltage divider and filter 506, a feedback and gain circuit 702, and a controller 704. Coils 510 and 512 of sensor 310 output signals proportional to the detected current imbalance. The signals from sensor 310 are passed to signal conditioners 504, which filter and buffer the signals. Controller 704 compares the conditioned signal to one or more thresholds to determine whether or not a ground fault condition exists. If the conditioned signal exceeds the trip threshold (whether because of an actual ground fault or because first switch 302 has been activated by the user), controller 704 causes trip circuit 106 to interrupt power flow through electronic trip device 700.

Voltage divider and filter 506 is coupled to second switch 304 and feedback and gain circuit 702. When second switch 304 is activated, feedback and gain circuit 702 changes a gain of controller 704 to reduce by a known amount the value of the current imbalance sensed by sensor 310. Controller 704 compares the reduced imbalance signal to a first threshold (also referred to as a test threshold) that is less than the trip threshold by the amount that the gain was reduced. Thus, for example, if feedback and gain controller 702 reduces the gain applied to the output of sensor 310 by fifty percent, controller 704 compares the imbalance signal to a test threshold of fifty percent of the trip threshold. If the detected current imbalance is within a test threshold range bounded by the first threshold and a second threshold, controller 702 causes indicator circuit 104 to indicate that electronic trip device 700 passed the test. If the detected current imbalance is less than the first threshold, controller causes indicator circuit to indicate that electronic trip device 700 failed the test. If the detected current imbalance is greater than the maximum of the test threshold range (i.e., the second threshold), there is likely an actual fault and the controller causes trip circuit 106 to trip electronic trip device 700. In the exemplary embodiment, controller 704 is an analog ground fault ASIC. In other embodiments, controller 704 is one or more central processing units, microprocessors, microcontrollers, reduced instruction set circuits (RISC), logic circuits, and any other circuit or processor capable of executing the functions described herein.

Figure 8:
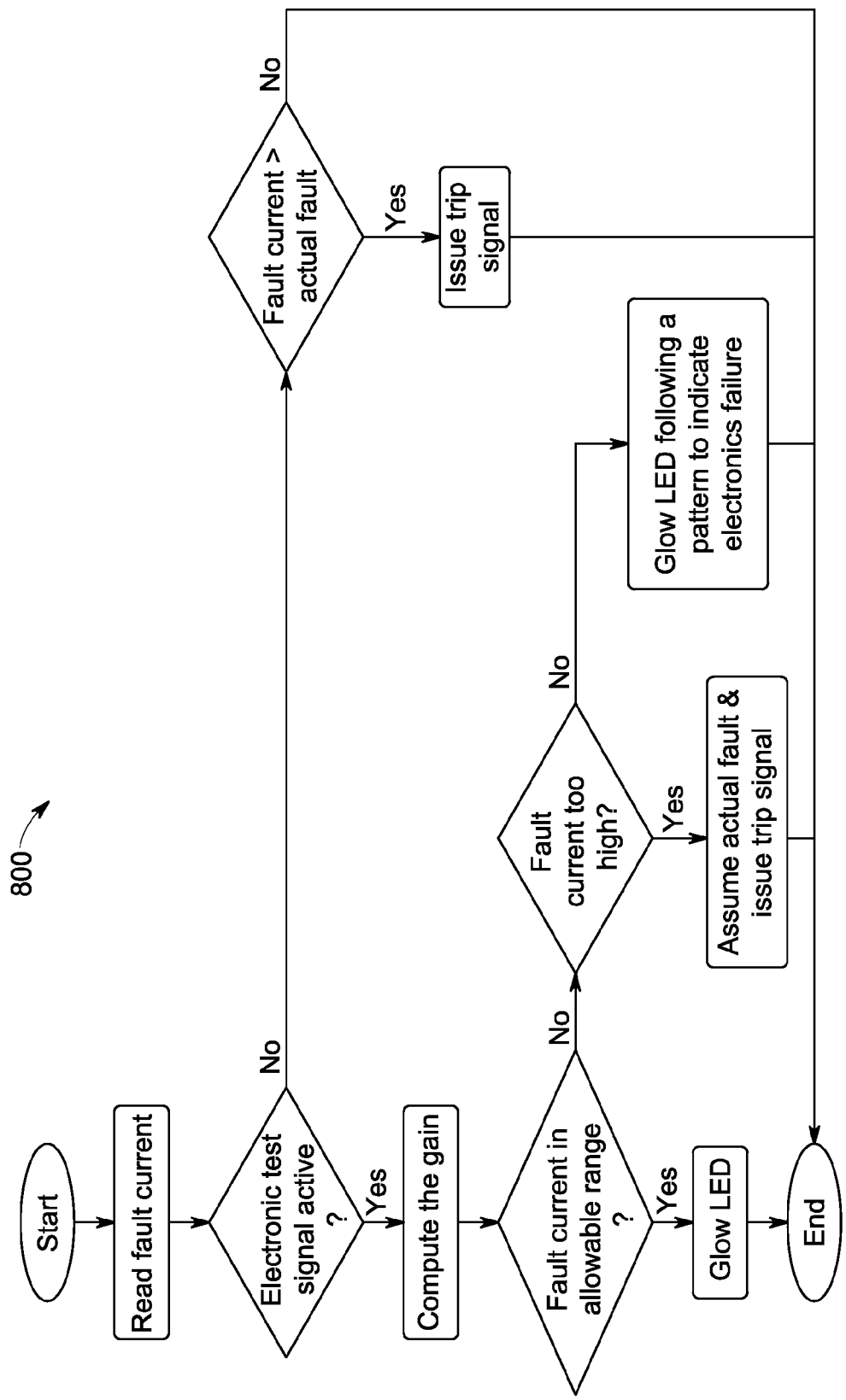
FIG. 8 is a flow chart of an exemplary method suitable for use with the exemplary electronic trip devices shown in FIGS. 1-7.

FIG. 8 is a flow chart of a method 800 of operating an electronic trip device, such as electronic trip device 100, 500, 600, or 700.

Figure 9:
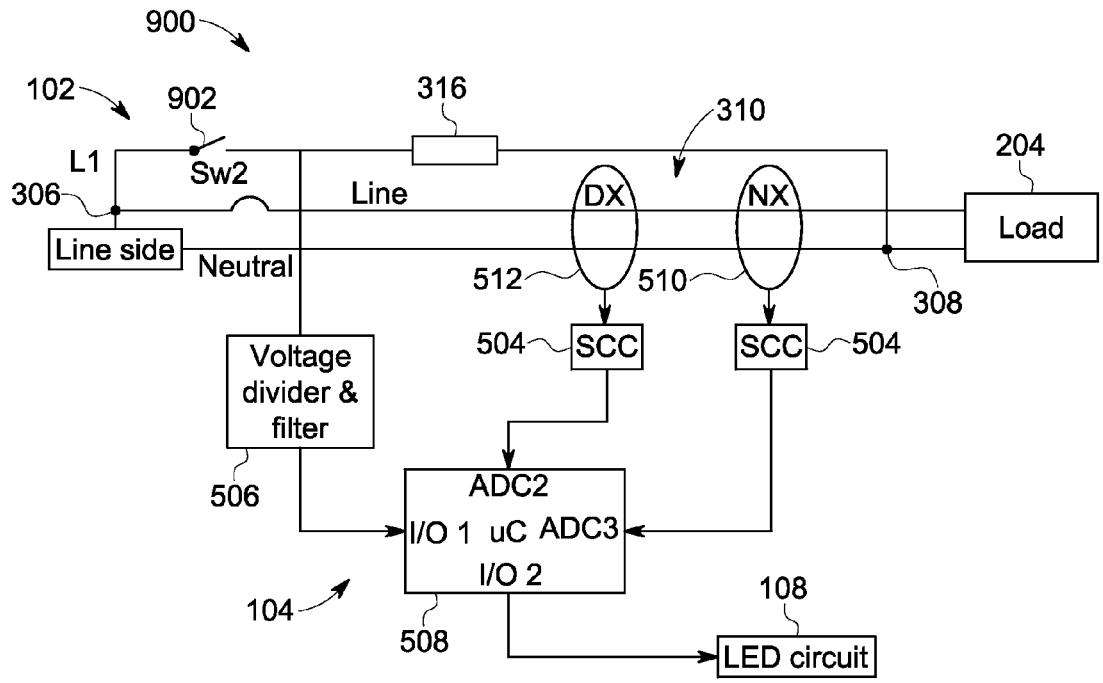
FIG. 9 is a diagram of a sixth exemplary electronic trip device suitable for use as the electronic trip device shown in FIG. 1.

FIG. 9 is another example electronic trip device 900 suitable for use as electronic trip device 100. Components that electronic trip device 900 has in common with electronic trip devices 300, 400, 500, 600, and 700 are identified by the same reference numbers. Except as described below, electronic trip device 900 operates in substantially the same manner as electronic trip device 500 described above. Notably, electronic trip device 900 does not include first switch 302 and first resistor 312 for initiating an active test including tripping of electronic trip device 900.

In electronic trip device 900, test signal generator 102 includes a test switch 902 for initiating an active test of electronic trip device 900 including tripping of electronic trip device 900 and initiating a passive test of electronic trip device 900 without tripping of electronic trip device 900. When a user activates test switch 902, current from first point 306 is coupled to second point 308 of the neutral conductor. Sensor 310 detects this test signal provided via test switch 902. Resistor 312 coupled to test switch 902 determines the magnitude of the current coupled from first point 306 to second point 308. The resistance of first resistor 312 is selected so that the current flowing between first point 306 and second point 308 does not exceed the trip threshold. Because the current imbalance detected by sensor 310 does not exceed the trip threshold, leakage detection circuit 104 will not cause trip circuit 106 to trip. Rather, if electronic trip device 900 is operating properly, leakage detection circuit 104 causes test indicator circuit 108 to indicate that electronic trip device 900 passed the test. If electronic trip device 300 is not operating properly, leakage detection circuit 104 causes test indicator circuit 108 to indicate that electronic trip device 900 has failed the test.

In this exemplary embodiment, controller 508 monitors how long test switch 902 remains activated. In the exemplary embodiment, test switch 902 is a normally open switch and activating test switch 902 closes test switch 902 to provide the test current as described above. In other embodiments any other suitable switch may be used including, for example, normally closed switches. If the length of time that test switch 902 is activated exceeds a time threshold, controller 508 actively test device 900 and causes trip circuit 106 to trip. The time threshold is longer than the amount of time that it takes for leakage detection circuit 104 to determine whether electronic trip device 900 passed or failed the passive test initiated by test switch 902 and cause test indicator 108 to indicate the results. Thus, a user may passively test electronic trip device 900 without tripping electronic trip device 900 by closing test switch 902 for a length of time less than the time threshold. In the exemplary embodiment, the time threshold is ten seconds. In other embodiments, any other suitable time threshold may be used. If the user desires to trip electronic trip device 900, for example to test the functioning of trip circuit 106, the user need only maintain test switch 902 in a closed position for longer than the time threshold.

Figure 10:
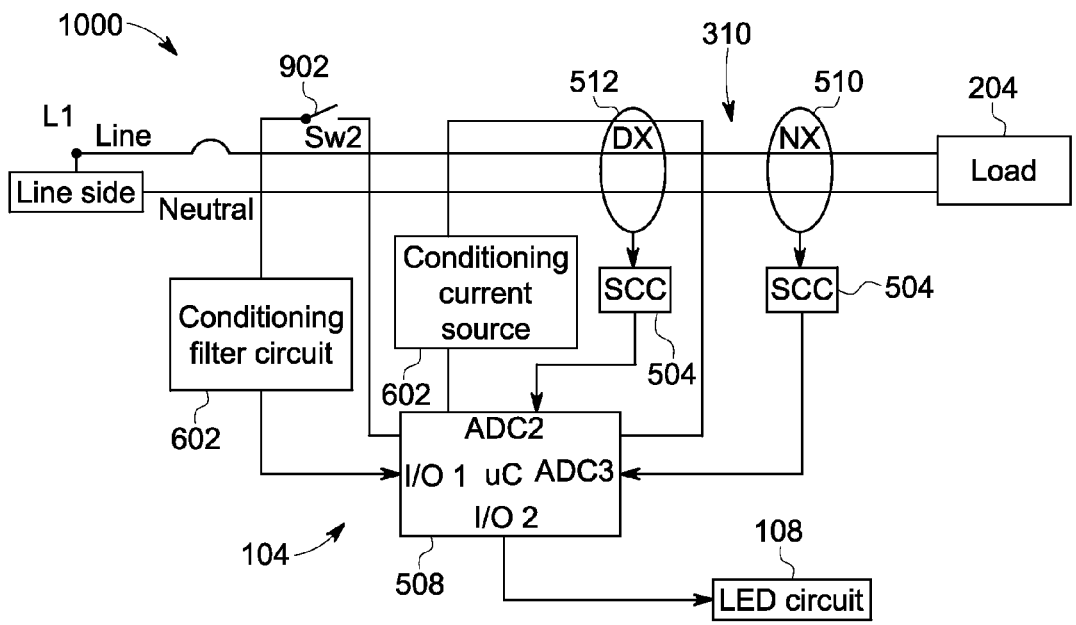
FIG. 10 is a diagram of a seventh exemplary electronic trip device suitable for use as the electronic trip device shown in FIG. 1

FIG. 10 is another example electronic trip device 1000 suitable for use as electronic trip device 100. Components that electronic trip device 1000 has in common with electronic trip devices 300, 400, 500, 600, 700, and 900 are identified by the same reference numbers. Except as described below, electronic trip device 1000 operates in substantially the same manner as electronic trip device 600 described above. Notably, electronic trip device 1000 does not include first switch 302 and first resistor 312 for initiating a test including tripping of electronic trip device 1000.

In electronic trip device 1000, test signal generator 102 includes test switch 902 for initiating an active test of electronic trip device 1000 including tripping of electronic trip device and initiating a passive test of electronic trip device 1000 without tripping of electronic trip device 1000. When a user activates test switch 902, controller 508 causes current source 602 to generate a known test current less than the trip threshold through sensor 310. Sensor 310 detects the test current and provides a signal proportional to the detected current imbalance to controller 508 via one of signal conditioners 504. Because the current imbalance detected by sensor 310 does not exceed the trip threshold, leakage detection circuit 104 will not cause trip circuit 106 to trip. Rather, if electronic trip device 1000 is operating properly, leakage detection circuit 104 causes test indicator circuit 108 to indicate that electronic trip device 1000 passed the test. If electronic trip device 300 is not operating properly, leakage detection circuit 104 causes test indicator circuit 108 to indicate that electronic trip device 1000 has failed the test.

In this exemplary embodiment, controller 508 monitors how long test switch 902 remains activated. If the length of time that test switch 902 is activated exceeds a time threshold, controller 508 causes trip circuit 106 to trip. The time threshold is longer than the amount of time that it takes for leakage detection circuit 104 to determine whether electronic trip device 1000 passed or failed the passive test initiated by test switch 902 and cause test indicator 108 to indicate the results. Thus, a user may test electronic trip device 1000 without tripping electronic trip device 1000 by activated test switch 902 for a length of time less than the time threshold. If the user desires to trip electronic trip device 1000, for example to test the functioning of trip circuit 106, the user need only maintain test switch 902 in a closed position for longer than the time threshold.

Figure 11:
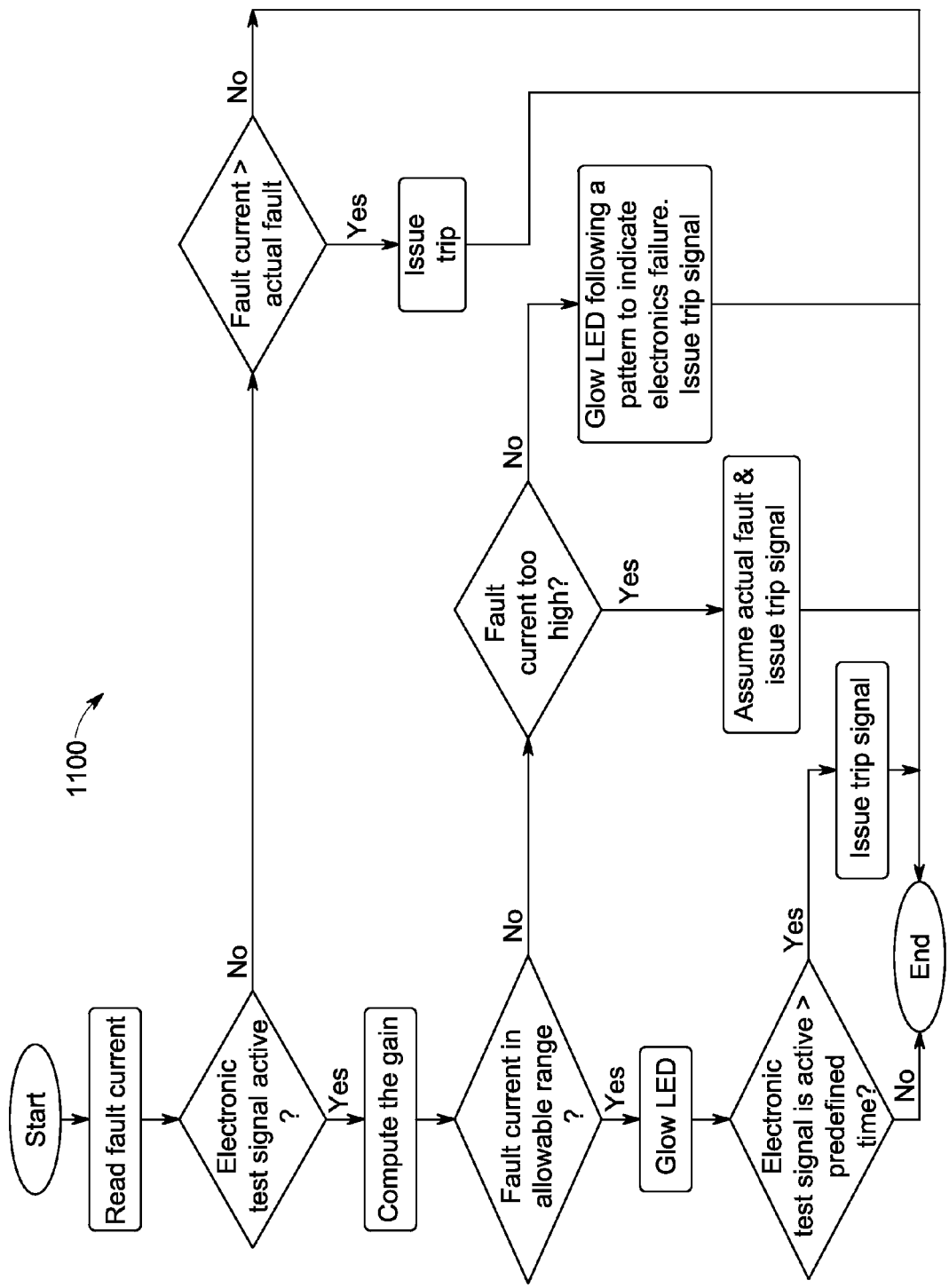
FIG. 11 is a flow chart of an exemplary method suitable for use with the exemplary electronic trip devices shown in FIGS. 1, 9, and 10.

FIG. 11 is a flow chart of a method 1100 of operating an electronic trip device, such as electronic trip device 100, 500, 600, or 700.

Although shown and described above with a single line conductor, electronic trip devices according to the present disclosure, such as electronic trip device 100, 300, 400, 500, 600, 700, 900, or 1000, may include more than one line conductor. Specifically, in some embodiments an electronic trip device includes two line conductors. In other embodiments, the electronic an electronic trip device includes three line conductors. In embodiments in which the electronic trip device includes more than one line conductor, the vector sum of the currents through the multiple line conductors are treated in the same manner as the current in the single line conductor current described above.

Described herein are exemplary methods and apparatus for operating an electronic trip device. More specifically, the methods and apparatus described herein facilitate testing a RCD to ensure the RCD is operational. The methods and apparatus permit selectively testing a RCD without tripping the RCD. Testing without tripping facilitates testing of the RCD without interrupting the flow of power to a load connected to the RCD. The methods and apparatus described herein thus facilitate testing in situations in which interruption of power to a load may not be desirable and in which testing of a RCD may otherwise not be regularly performed. The methods and apparatus also permit selective testing of the RCD with tripping of the RCD. This permits a user to test the functionality of the trip mechanisms of the RCD to ensure that the RCD not only properly detects a ground fault, but also properly disconnects its load from power.

The methods and apparatus described herein facilitate efficient and economical operation of an electronic trip device. Exemplary embodiments of methods and apparatus are described and/or illustrated herein in detail. The methods and apparatus are not limited to the specific embodiments described herein, but rather, components of each apparatus, as well as steps of each method, may be utilized independently and separately from other components and steps described herein. Each component, and each method step, can also be used in combination with other components and/or method steps.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A residual current device (RCD) comprising:
    a sensor configured to detect a current difference between at least two conductors and output a detection signal proportional to the detected current difference;
    a test current generator configured for selectively passively testing said RCD in a first mode and actively testing said RCD in a second mode, said test current generator configured to provide, in response to a selection to test said RCD, a test signal to produce a current difference detectable by the sensor;
    a detection circuit coupled to said sensor, said detection circuit configured to:
        compare the detection signal to a trip threshold and output a trip signal if the detection signal exceeds the trip threshold;
        compare the detection signal to a test threshold in response to the selection to passively test said RCD in the first mode and provide a tripless indication of whether said RCD is operating properly, wherein the test threshold is less than the trip threshold; and
        output a trip signal in response to the detection signal and a selection to actively test said RCD in the second mode.

2. A RCD in accordance with claim 1, further comprising a trip circuit coupled to said detection circuit and configured to interrupt a flow of current through said RCD in response to the trip signal.

3. A RCD in accordance with claim 1, wherein said sensor comprises a current transformer.

4. A RCD in accordance with claim 1, further comprising an indicator circuit coupled to said detection circuit to provide the tripless indication, said indicator circuit configured to provide a visual indication of whether said RCD is operating properly.

5. A RCD in accordance with claim 1, wherein said test current generator is configured to selectively provide the test signal with a magnitude that exceeds the trip threshold in response to a selection to actively test said RCD.

6. A RCD in accordance with claim 5, wherein said test current generator is configured to provide the test signal with a magnitude that is less than the trip threshold in response to a selection to passively test said RCD.

7. A RCD in accordance with claim 5, wherein said test current generator is configured provide the test signal with a magnitude that is greater than the trip threshold in response to a selection to passively test said RCD, and wherein said detection circuit is configured to reduce a gain applied to the detection signal in response to the selection to passively test said RCD.

8. A RCD in accordance with claim 7, wherein the test threshold is less than the trip threshold by a percentage substantially the same as a percentage by which the gain applied to the detection signal is reduced in response to the selection to passively test said RCD.

* * * * *